United States Patent [19]

Sauer

[11] Patent Number: 4,603,426
[45] Date of Patent: Jul. 29, 1986

[54] FLOATING-DIFFUSION CHARGE SENSING FOR BURIED-CHANNEL CCD USING A DOUBLED CLOCKING VOLTAGE

[75] Inventor: Donald J. Sauer, Monmouth, N.J.
[73] Assignee: RCA Corporation, Princeton, N.J.
[21] Appl. No.: 719,809
[22] Filed: Apr. 4, 1985
[51] Int. Cl.⁴ .................... G11C 19/28; H01L 29/78
[52] U.S. Cl. ............................................ 377/60; 357/24
[58] Field of Search .................. 357/24; 377/57-63

[56] References Cited

U.S. PATENT DOCUMENTS

| | | | |
|---|---|---|---|
| 4,139,784 | 2/1979 | Sauer | 357/24 LR |
| 4,389,615 | 6/1983 | French et al. | 357/24 M |
| 4,513,431 | 4/1985 | Chamberlain et al. | 357/24 M |

Primary Examiner—Gene M. Munson
Attorney, Agent, or Firm—Joseph S. Tripoli; George E. Haas; Allen L. Limberg

[57] ABSTRACT

A cacade connection of a buried channel CCD clocked with clocking signals of a few volts and a floating-diffusion electrometer operated at voltages no larger than those few volts. Undesirable flow back of charge into the CCD from the electrometer is forestalled by applying to the last CCD charge transfer stage a clocking signal voltage developed by doubling the few-volt clocking signals applied to the earlier charge transfer stages of the CCD.

4 Claims, 5 Drawing Figures

FLOATING-DIFFUSION CHARGE SENSING FOR BURIED-CHANNEL CCD USING A DOUBLED CLOCKING VOLTAGE

The invention relates to floating-diffusion charge sensing circuitry for converting charge packets from a buried-channel charge-coupled device (CCD) to voltage samples.

BACKGROUND OF THE INVENTION

A problem encountered in the design of buried-channel CCD's to operate with 0-5 volt clock signals is the design of an output stage which can also be operated from the standard 5-volt power supply, so one can avoid the need for a high voltage supply. The problem arises due to the offset between in-channel potentials in the buried-channel and the gate potentials applied to the gate electrodes of these devices to induce these in-channel potentials. Consider a fabrication process using n-type charge transfer channels buried in a p-type silicon substrate. Two-phase clocking is used with each two-phase gate electrode structure consisting of a first-polysilicon-layer gate electrode preceded by a second-polysilicon-layer gate electrode receptive of the same gate electrode potential. This induces a two-step staircase potential profile under each two-phase gate electrode structure that facilitates charge transfer only in a forward direction. The in-channel potentials under the first-polysilicon-layer gate electrodes tend to be five or six volts more positive than the gate electrode potentials inducing them. If one uses 0-5 volt clock voltages on the gate electrodes of the buried-channel CCD, and follows the CCD with a floating-diffusion electrometer in which the floating diffusion is periodically reset to 5 volts, signal charge that has been transferred under the floating diffusion will tend to flow back under that gate electrode, as the clocking voltage applied to the first-polysilicon-layer gate electrode immediately preceding the floating diffusion goes positive. This back flow of charge causes a non-linear reduction in the signal voltage developed on the floating diffusion, which effect is undesirable.

Deriving higher reset drain voltages from the 5 volt supply, using voltage-doubling or voltage-tripling techniques, is an unattractive solution to this problem. If the reset drain voltage is increased, the drain voltages on the field effect transistor used in the electrometer and the source follower thereafter have to be increased also. The current demands of the field effect transistors require capacitor sizes in the doubler or tripler that are, practically speaking, too large to be integrated on the same semiconductor substrate as the burried channel CCD.

SUMMARY OF THE INVENTION

The buried channel CCD proceding a floating-diffusion electrometer is operated, in accordance with the invention, by applying a doubled clock voltage to a two-phase gate electrode structure over an extension of the buried channel in which the floating diffusion is disposed. A voltage doubler is, in a preferred embodiment of the invention, constructed on the same semiconductive substrate as the buried-channel CCD, using field effect transistors with channels induced in the same type of semiconductor material as used to form the buried channel CCD.

DETAILED DESCRIPTION

Figure 1:
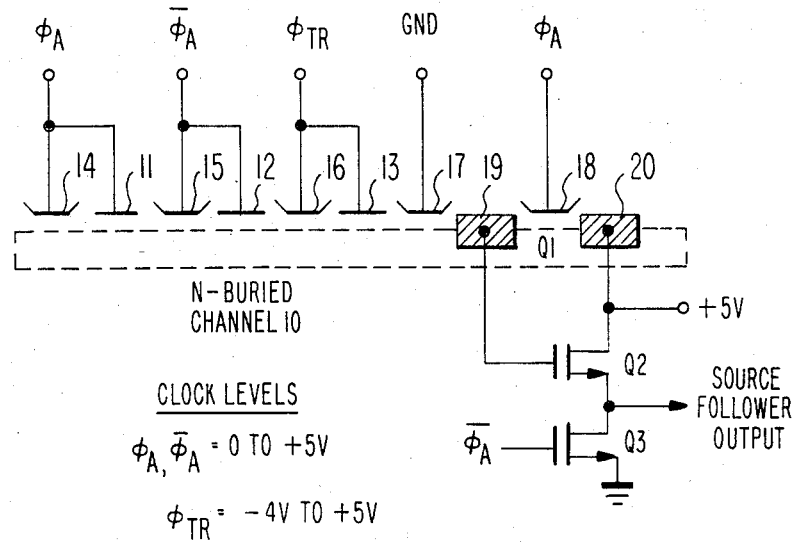
FIG. 1 is a schematic diagram of the buried-channel CCD and floating-diffusion electrometer as operated in accordance with the invention.

FIG. 1 top shows (in the conventionally stylized form) the final portions of a buried channel CCD. The n-type buried channel 10 is beneath the surface of a p-type silicon substrate. First-polysilicon-layer gate electrodes 11, 12, 13 overlying the buried channel are shown as horizontal straight lines, and second-polysilicon-layer gate electrodes 14, 15, 16, 17 and 18 overlying the buried channel are shown as horizontal straight lines bent up at their ends. Each of a number of two-phase gate electrode structures consists of a second-polysilicon-layer gate electrode followed by a first-polysilicon-layer gate electrode, both of which gate electrodes receive the same gate potential. Two phases $\phi_A$ and $\overline{\phi}_A$ of clocking voltage switching from zero to five volts in antiphase are used, being applied in alternate sequence to a successive two-phase gate electrode structures crossing the buried channel 10 (only the last two two-phase gate electrode structures of this succession being explicitly shown in FIG. 1). The last in this succession of two-phase gate electrode structures (consisting of gate electrode 15, 12) has $\overline{\phi}_A$ applied to it. Buried channel 10, then, has an extension to the right in which portions of the charge sensing output circuitry lie.

A subsequent two-phase gate electrode structure (consisting of gate electrodes 16, 13) is then receptive of the potential $\phi_{TR}$ generated from $\phi_A$ by voltage doubling. $\phi_{TR}$ has a positive excursion substantially the same +5 volts as $\phi_A$ has. $\phi_{TR}$ has a negative excursion to −4 volts after $\phi_A$ falls to zero, which is achieved through the voltage doubling process. This feature characterizes the invention.

A second-polysilicon-layer d-c gate electrode 17 follows. It is most convenient to apply substrate potential GND, or ground, to gate electrode 17. This can be done because $\phi_{TR}$ has a sufficiently negative excursion to transfer charge over the grounded d-c gate electrode. Substrate potential is the zero volts reference from which the clocking voltages mentioned in this specification are measured.

A floating diffusion 19, after the d-c gate electrode, is ohmically contacted and connected to the gate electrode of a field effect transistor Q2. Voltage applied to the gate electrode of Q2 includes an n-type channel between n+ source and drain diffusions. Q2 is operated as an electrometer, being connected as a source follower with drain connection to direct +5 V supply voltage and with source connection to ground. This source connection is shown as being through the conduction channel of a field effect transistor Q3 pulsed into conduction by $\overline{\phi}_A$ applied to its gate electrode going to +5 volts. A reset drain 20 is located at the end of the buried channel extension and is ohmically contacted for application of a direct +5 V reset drain potential. A reset gate electrode 18 between floating diffusion 19 and drain diffusion 20 receives $\phi_A$ as reset pulses, to clamp floating diffusion to the +5 V reset drain potential when $\phi_A$ goes positive; this dc-restores signal at the gate of electrometer transistor Q2.

Figure 2:
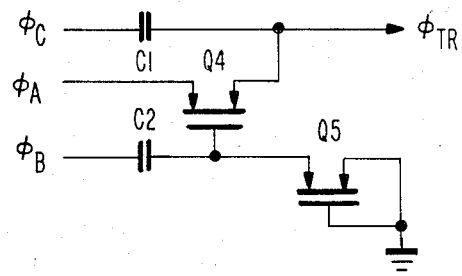
FIG. 2 is a schematic diagram of the voltage doubler used to generate the doubled clock voltage applied in the invention to the two-phase gate electrode structure preceding the floating diffusion of the electrometer.
Figure 3:
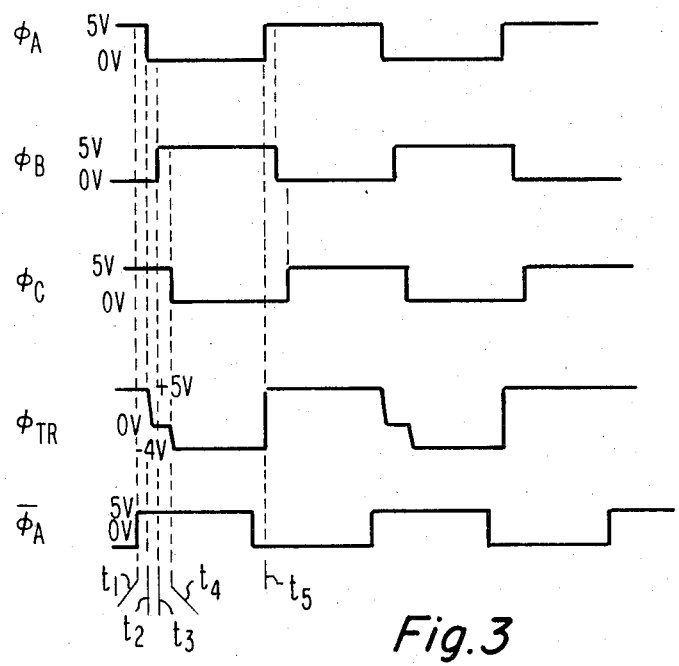
FIG. 3 is a timing diagram of clocking voltages applied to the FIG. 2 voltage doubler.

FIG. 2 shows a preferred voltage doubler configuration for generating $\phi_{TR}$. In addition to $\phi_A$ clocking voltage, two further clocking voltages $\phi_B$ and $\phi_C$ are used. The characteristics and relative timing of clocking voltages $\phi_A$, $\overline{\phi}_A$, $\phi_B$ and $\phi_C$ are shown in the FIG. 3 timing diagram. Operation of the voltage doubler is most easily understood by referring to both FIGS. 2 and 3. In FIG. 3 the transitions in $\phi_A$ are delayed from those of $\overline{\phi}_A$. This is attributable to $\phi_A$ being generated at the drain to drain connection of an n-type field effect transistor and a p-type field effect transistor connected gate to gate, to receive $\overline{\phi}_A$ and connected at their sources to receive 0 volts and +5 volts, respectively. The n-type and p-type field effect transistors in this logic inverter connection are not explicitly shown in the drawing.

The FIG. 2 voltage doubler uses two p-channel field effect transistors, Q4 and Q5. Voltages applied to their gate electrodes induce p-channels between p+ source drain diffusions in the n-well(s) in which Q4 and Q5 are disposed. The n-well(s) are connected to +5 volt potential, so voltage swings in the operation of Q4 and Q5 may be substantially downward from +5 volt potential - even negative with respect to p-type substrate ground. The potential at the gate electrode of Q4 is level-shifted from $\phi_B$ by capacitor C2 and diode-connected Q5 to be about +1.5 volts when $\phi_B$ is +5 volts and to be about −3 volts when $\phi_B$ is at zero volts. That is, positive excursions of $\phi_B$ drive diode-connected Q5 into conduction, to clamp the gate electrode of Q4 to Q5 gate-to-source threshold voltage (+1.5 volts) above ground.

At time $t_1$, when $\phi_A$ is at +5 volts, $\phi_{TR}$ is clamped to that +5 volts by conduction of Q4 channel. That is, the −3 volts on the gate electrode of Q4 acting against a +5 volt "source" potential $\phi_A$ causes Q4 to conduct, to bring the "drain" potential $\phi_{TR}$ to the +5 volt "source" potential.

At time $t_2$, $\phi_A$ goes to zero volts, becoming the "drain" potential of Q4, with $\phi_{TR}$ becoming the "source" potential of Q4. $\phi_B$ remains zero volts, maintaining the −3 volt gate potential on Q4; therefore Q4 remains conductive to pull its "drain" potential $\phi_{TR}$ to zero volts. $\phi_C$ remains at +5 volts, so C1 is charged to place five volts between its plates.

At time $t_3$, $\phi_B$ goes to +5 volts, and the gate potential of Q4 goes to the +1.5 volts source-to-gate threshold voltage of Q5. This renders Q4 channel nonconductive, both ends thereof being negative respective to its gate electrode.

At time $t_4$, $\phi_C$ goes to zero volts, and charge on C1 supporting a five volt potential between its plates forces $\phi_{TR}$ towards −5 volts. If C1 is sufficiently large in capacitance compared to the capacitance to substrate of gate electrodes 16 and 18 (of FIG. 1), $\phi_{TR}$ will go a substantial portion (e.g., −4 volts) of the −5 volt excursion that is possible.

At time $t_5$, $\phi_A$ returns to +5 volts and is the "source" voltage for rendering Q4 channel conductive. This completes the cycle of operation, which then recurs.

Figure 4:
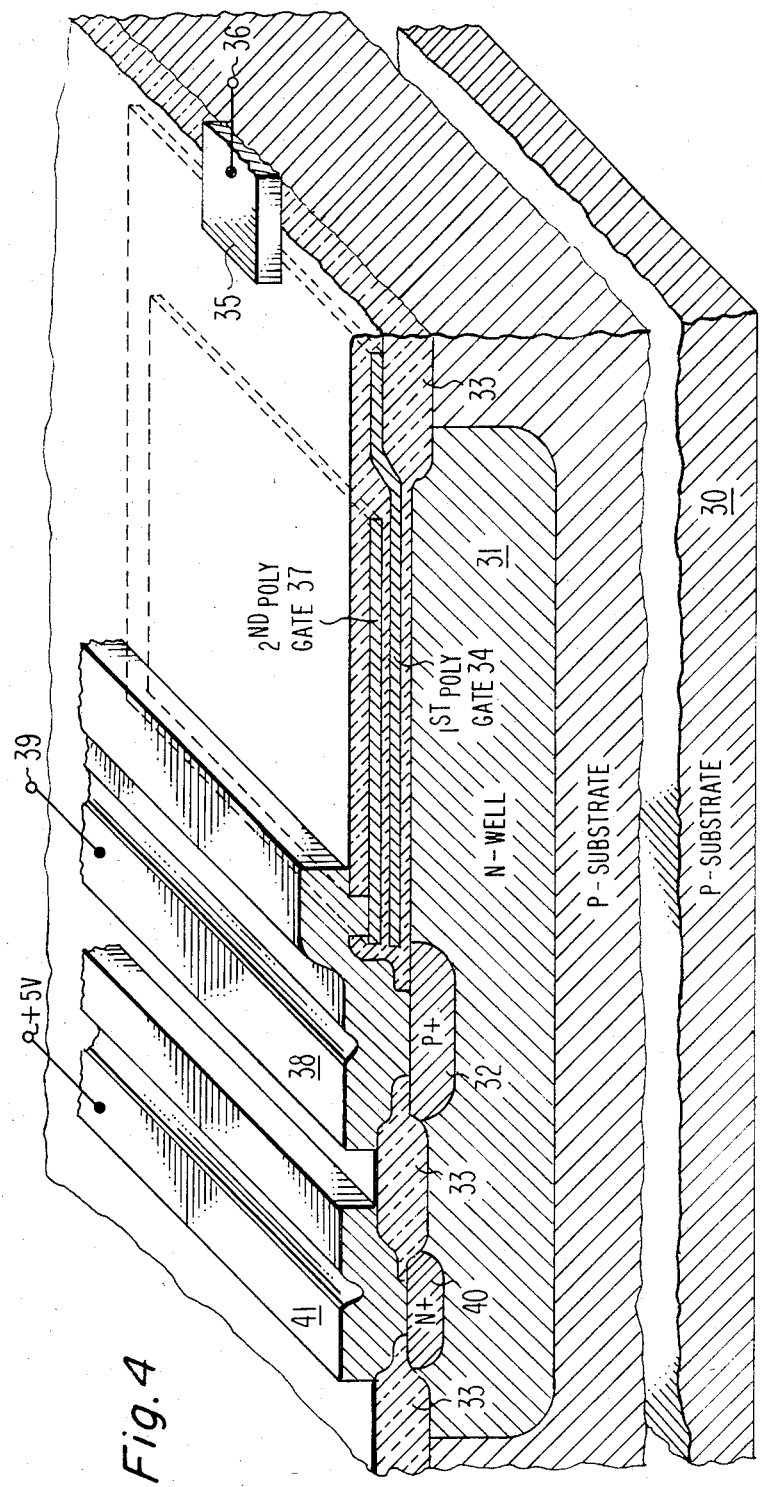
FIG. 4 shows an artificial-perspective view of a preferred capacitor structure for use in the FIG. 2 voltage doubler, cut away to reveal the profile structure.

FIG. 4 shows a preferred form for the capacitors C1 and C2 formed by a parallel combination. The p substrate 30 has a portion of its thickness removed, and vertical dimensions in the profile section are exaggerated. A PMOS structure is formed in an n-well 31 diffused into the top surface of substrate 30 by diffusing a p+ drain-source diffusion 32 into n-well 31 through an opening in the thick oxide 33 and by forming a first-polysilicon-layer gate electrode structure 34 over a portion of n-well 31 covered by thin oxide. Gate electrode structure 34 is ohmically contacted to aluminum bus 35 connecting to a first plate, 36, of the FIG. 4 capacitor structure. Gate electrode structure 34 is covered by a thin oxide layer, except where ohmically contacted; and a second-polysilicon-layer gate electrode structure 37 is disposed on that thin oxide layer. Gate electrode 37 and p+ diffusion 32 are ohmically contacted to aluminum bus 38 connecting to a second plate, 39, of the FIG. 4 capacitor structure. An n+ diffusion 40 in n-well 31 is ohmically contacted to aluminum bus 41, and bus 41 is connected to the most positive CCD voltage, +5 volts.

Figure 5:
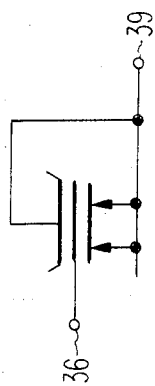
FIG. 5 is a schematic representation of the FIG. 4 structure.

Minor variants are possible in this structure, which parallels a PMOS capacitor with an overlying capacitor formed between first and second polysilicon electrodes. FIG. 5 shows a schematic representative of these structures.

The two-phase gate electrode structure means comprising a second-polysilicon-layer gate electrode followed by a first-polysilicon-layer gate electrode electrically connected thereto can, as known, be replaced with a single gate electrode structure. Charge transfer directionability is then achieved by differential doping along the length of the gate in the channel, or by varying the thickness of the oxide under the single gate electrode structure. Such modifications are possible to provide other embodiments of the invention.

What is claimed is:

1. An output stage for a buried channel charge-coupled device, having a buried channel of a first conductivity type semiconductive material below a surface of a substrate of a second conductivity type semiconductive material, and having a succession of gate electrodes disposed adjacent to said surface to which two-phase clocking signals $\phi_A$ and $\overline{\phi}_A$ are applied, each of the clocking signal phases exhibiting an excursion from the potential of said substrate to a potential of a first polarity, the final gate electrode in said succession being receptive of $\overline{\phi}_A$, said output stage comprising:

an extension of said buried channel to a reset drain diffusion connected to receive a reset drain potential of said first polarity as referred to the substrate potential, said reset drain potential being not substantially larger than the excursions of said first polarity of $\phi_A$ and $\overline{\phi}_A$;

a floating diffusion disposed in said buried channel extension, said floating diffusion and said reset drain diffusion being of said first type of semiconductive material of relatively high doping compared to said buried channel and its extension;

a first field effect transistor, being disposed on said substrate, having a gate electrode ohmically contacted to said floating diffusion, and having ohmically contacted source and drain diffusions;

means connecting said first field effect transistor for operating it as a floating-diffusion electrometer;

a reset gate electrode disposed adjacent to said substrate surface, over said buried channel extension, and between said floating diffusion and said reset drain diffusion, to which reset gate electrode reset pulses are recurrently applied for clamping said floating diffusion to said reset drain as a part of operating said first field effect transistor as a floating diffusion electrometer;

a d-c gate electrode disposed adjacent to said substrate surface, over said buried channel extension, and between the final gate electrode in said succession and said floating diffusion;

two-phase gate electrode structure means adjacent to said substrate surface, over said buried channel extension, and between the final gate electrode in said succession and said d-c gate electrode, for inducing a two-step potential staircase in the portion of said buried channel extension thereunder tending to transfer charge towards said floating diffusion, which staircase is superposed on a potential related to the potential applied to ohmic contacting of said two-phase gate electrode structure means;

a voltage doubler for doubling the potential excursions of said $\phi_A$ phase of clocking signal, thereby to generate a doubled voltage, with excursions of said first polarity as referred to the potential of said substrate corresponding to those of said $\phi_A$ phase of clocking signal, and with intervening excursions of a second polarity opposite to the first polarity as referred to the potential of said substrate; and means for applying said doubled potential to the ohmic contacting of said two-phase gate electrode structure means.

2. An output stage for a buried channel charge-coupled device as set forth in claim 1 wherein said means for generating said potential applied to the ohmic contacting of said two-phase gate electrode structure means comprises:

means for generating a clocking signal $\phi_B$ with a transition from said substrate potential to said first polarity potential following each transition of $\phi_A$ to substrate potential;

means for generating a clocking signal $\phi_C$ with a transition from said first plurality potential to said substrate potential following each transition of $\phi_B$ from said substrate potential to said first polarity potential;

a well of second conductivity type in said substrate next to said surface;

first and second diffusions of said first conductivity type in said well for defining the ends of the conduction channel of a second field effect transistor, and a gate electrode for said second field effect transistor, said first diffusion being ohmically contacted and galvanically connected to the ohmic contacting of said two-phase gate electrode structure means;

a first capacitor having a first plate connection to which $\phi_C$ is applied and having a second plate connection to the ohmic contacting of said two-phase gate electrode structure means;

a second capacitor having a first plate connection to which $\phi_B$ is applied and having a second plate connection to the gate electrode for said second field effect transistor; and undirectionally conductive means for conducting from the gate electrode of said second field effect transistor to said substrate potential on excursions of $\phi_B$ from said substrate potential.

3. An output stage for a buried channel charge-coupled device as set forth in claim 2, wherein said undirectionally conductive means comprises:

third and fourth diffusions of said first conductivity type in said well for defining the ends of a third field effect transistor, and a gate electrode for said third transistor connected to receive substrate potential, said third diffusion being ohmically contacted and connected to the gate electrode for said second field effect transistor, and said fourth diffusion being ohmically contacted and connected to receive substrate potential.

4. An output stage for a buried channel charge-coupled device as set forth in claim 1 wherein said two-phase gate electrode structure means comprises a second-polysilicon-layer gate electrode succeeded by a first-polysilicon-layer gate electrode respectively ohmically contacted to the same electrical connection.

* * * * *